United States Patent
Liu et al.

(10) Patent No.: US 7,214,611 B2
(45) Date of Patent: May 8, 2007

(54) IMPRINTING-DAMASCENE PROCESS FOR METAL INTERCONNECTION

(75) Inventors: Jen Fu Liu, Hsinchu (TW); Yung Jen Hsu, Hsinchu (TW); Jiann Heng Chen, Hsinchu (TW); Fon Shan Huang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 11/208,624

(22) Filed: Aug. 23, 2005

(65) Prior Publication Data

US 2006/0199380 A1  Sep. 7, 2006

(30) Foreign Application Priority Data

Jun. 3, 2005  (TW) .............................. 94118432 A

(51) Int. Cl.
   *H01L 21/4763*  (2006.01)

(52) U.S. Cl. ...................... 438/637; 438/648; 438/650; 257/E21.585; 977/701; 977/720; 977/721

(58) Field of Classification Search ........ 438/584–586, 438/618, 637, 638, 648, 650; 216/54; 257/E21.347, 257/E21.582, E21.584, E21.585; 977/700, 977/701, 712, 902, 932, 950, 720, 721
See application file for complete search history.

(56) References Cited

U.S. PATENT DOCUMENTS

2003/0071016 A1*  4/2003  Shih et al. .................... 216/54
2004/0250945 A1*  12/2004  Zheng et al. ............... 156/230

* cited by examiner

*Primary Examiner*—Brook Kebede
(74) *Attorney, Agent, or Firm*—Troxell Law Office, PLLC

(57) ABSTRACT

The present invention first obtains a nano-metal line by an e-beam lithography and an electroless plating, and imprints the line into a material with low-K to obtain a damascene metal line with low cost and high throughput, as a future solution for a metallization process for a general low-K metal damascene structure through CMP.

9 Claims, 18 Drawing Sheets

IMPRINTING-DAMASCENE PROCESS FOR METAL INTERCONNECTION

FIELD OF THE INVENTION

The present invention relates to a metal-line imprinting; more particularly, relates to obtaining a nano-metal line by an e-beam lithography and an electroless plating and imprinting the line into a material with low-K to obtain a damascene metal line with low cost and high throughput.

DESCRIPTION OF THE RELATED ARTS

As disclosed in Mehdi Moussavi's article, "Challenges in Microelectronics," C. R. Acad. Sci. Paris, t.1, IV, 929–939, 2000, damascene architecture is a commonly used process in which a dielectric is deposited first followed by a lithography and an etching; and then a metal, Cu, is deposited and polished. As comparing to an aluminum interconnection, the Cu damascene architecture reduces the RC (resistant×capacitance) time delay and obtains superior resistance to electromigration.

Besides, as disclosed by Peter Singer in his "Copper has enormous benefits when compared to aluminum, but its implementation requires some fundamental changes in process technologies," Semiconductor International, 91, June 1998, the approach for a damascene architecture requires 20–30% fewer steps than the conventional etching patterning process.

According to ITRS (International Technology Roadmap for Semiconductors Conference) 2003 update, the 65 nm generation will be in 2007. As design rules of ULSI continue to shrink, interconnect processes must be compatible with device roadmaps and must meet manufacturing targets, where the processes for etching, cleaning, filling high aspect ratio structure, and CMP will be challenging, especially with a low-k damascene metal structure. Combinations of materials and processes used to fabricate new structures surely create integration complexity. Please refer to FIG. 6a through FIG. 6e, which are views showing the imprinting process for a damascene metal-line architecture of a prior art. In a conventional metal damascene process, the trenches are fabricated by a low-K dry etching after a photolithography. The barrier or seed layer (e.g. Ta, Ti, or W) with a thickness of ~10–20 nm is deposited by a PVD (Physical Vapor Deposition) or a CVD (Chemical Vapor Deposition); and a metal, Cu, is deposited by an electroplating or a CVD. The Cu is planarized by a chemical-mechanical polishing (CMP) and the etching is stopped on the barrier layer. And, extra seed layer is removed by a wet chemical etching. And, as disclosed by M. Fayolle, et al. in their article, "Challenges of Back End of the Line for Sub-65 nm Generation," Microelectronic Engineering, 70, 255–266, 2003, the etching, the cleaning, the filling of the high aspect ratio structure, and the CMP is challenging for design rules of ULSI as they continue to shrink. Traditional interconnect scaling will no longer satisfy performance requirements. Defining and finding solutions beyond low-k damascene metal architecture is necessary.

Imprinting lithography has the potential to be a cost-effective solution. It is essentially a micro-molding process in which topography of a template defines patterns created on a substrate. An imprint process is accomplished by heating a photoresist under a temperature above its glass transition temperature and imparting a relatively large force to transfer the patterns into the heated photoresist. A photoresist relief pattern is obtained by deforming the physical shape of the photoresist with an embossing, rather than by modifying the chemical structure of the photo resist with a radiation or a self-assembly. The principles for the nanoimprint lithography make the lithography capable of producing sub-10 nm features over a large area with high throughput and low cost.

As disclosed in an article by Stephen Y. Chou et al., "Sub-10 nm Imprint Lithography and Applications," J. Vac. Sci. Technol., B15 (6), 2897–2904, 1997, a solid mold, such as silicon or nickel, is used. Arrays of 10–40 nm period holes are imprinted in a PMMA on a Si or gold substrates.

A variety of different devices, such us ring transistors, MOSFET, MESFET, have been fabricated by a number of different researchers using the above approach. In the article by Chung Yen Chao et al., "Polymer Microring Resonators Fabricated by Nanoimprint Technique," J. Vac. Sci. Technol., B20 (6), 2862–2866, 1997, investigations indicate that imprint lithography resolution is only limited by the resolution of the template fabrication process. So, an important advantages over photolithography and other NGL technologies is obtained since it require no expensive projection optics, advanced illumination source, or specialized resist materials.

In 2001, a Room Temperature Nanoimprint Lithography (RT-NIL) has been demonstrated in S. Matsui et al.'s article, "Room Temperature Replication in Spin on Glass by Nanoimprint Techonogy," J. Vac. Sci. Technol., B19 (6), 2801–2805, 2001, and S. Matsui et al.'s article, "Room-Temperature Nanoimprint and Nanotransfer Printing Using Hydrogensilsequioxane," J. Vac. Sci. Technol., B21 (2), 688–692, 2003, which use a SOG (spin-on-glass) or a hydrogen silsesquioxane (HSQ), instead of PMMA, as an imprint photoresist material. A pattern with HSQ-replicated holes having a diameter of 90 nm and lines having a width of 50 nm is fabricated. A nanotransfer printing (NTP) technique is also developed to transfer photoresist/Au pattern from Si mould onto an HSQ-coated Si substrate by using the adhesion characteristic of HSQ where the mould is removed by a driving power of a stepper motor. An Au pattern is fabricated by a lift-off process and the HSQ is prebaked for 20 min at 50° C. The imprint pressure is about 4.0 MPa at room temperature. The room temperature nanoimprint only gives rise to elastic deformation on HSQ; yet, pattern size will shrink with the time. Meanwhile, the liftoff technique will face difficulty in nano-size pattern. So, the prior arts do not fulfill users' requests on actual use.

SUMMARY OF THE INVENTION

The main purpose of the present invention is to find a solution beyond low-k damascene metal architecture.

Another purpose of the present invention is to develop a low-cost and high-throughput imprinting technology for ULSI low-k damascene metal architecture.

Still another purpose of the present invention is to develop a high-resolution and stable imprinting mold for patterning low-k materials for future ULSI metallization applications.

Still another purpose of the present invention is to develop technology for a high-resolution patterning of metal line for future ULSI metallization applications.

Still another purpose of the present invention is to develop a stabile SOG/HSQ NIL or metal transferring process for the future ULSI metallization applications.

Still another purpose of the present invention is to provide a method to integrate the processes for the new low-k damascene metal architecture.

To achieve the above purposes, the present invention is an imprinting-damascene process for a metal interconnection, where a metal-line mold is obtained through an electroless plating; a layer of a porous SOG/HSQ is obtained through a spin-on coating; the metal-line mold is imprinted to the layer of the porous SOG/HSQ to contact the underlaid metal; and, some part of the metal-line mold is removed to obtain the metal line on the layer. Through the above procedure, a single level of metal damascene structure is obtained with low cost and high throughput. An ULSI structure with a plurality of levels of metal damascene structure can be obtained through processing the procedure for a plurality of times. Accordingly, a novel imprinting-damascene process for a metal interconnection is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1a through FIG. 1c are views showing step (a) of an imprinting-damascene process according to a preferred embodiment of the present invention;

DESCRIPTION OF THE PREFERRED EMBODIMENT

The following description of the preferred embodiment is provided to understand the features and the structures of the present invention.

The present invention is an imprinting-damascene process for a metal interconnection, comprising steps of:

(a) obtaining a metal mold with a metal line by an e-beam lithography and an electroless plating;

(b) obtaining a spin-on low-K layer; and (c) transferring the metal mold into the spin-on low-K layer to obtain the metal line by processing an NTP (Nano-Transfer Printing).

Figure 1A:
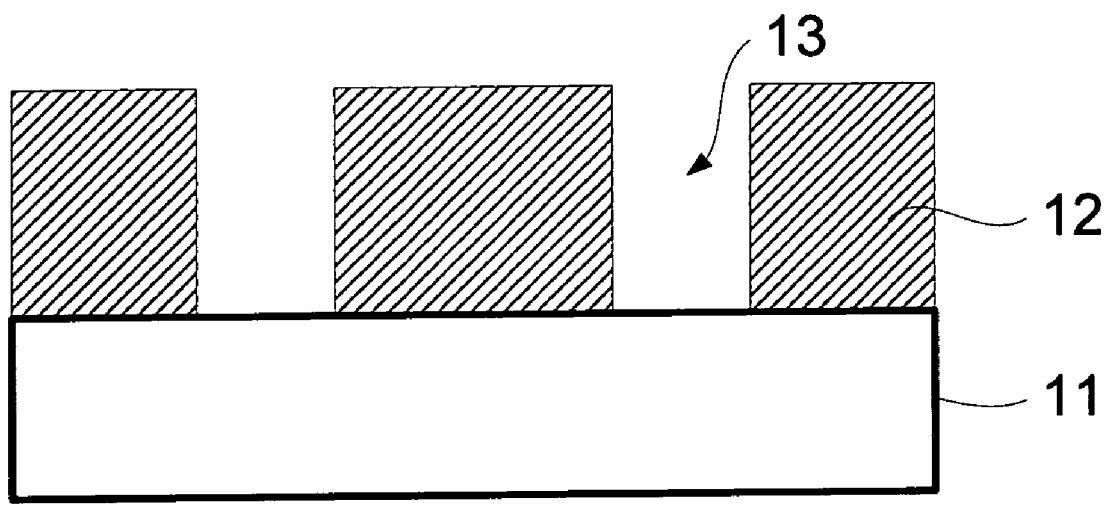
FIG. 1d is a view showing step (b) of the imprinting-damascene process according to the preferred embodiment of the present invention.
FIG. 1e and FIG. 1f are views showing step (c) of the imprinting-damascene process according to the preferred embodiment of the present invention.
Figure 1B:
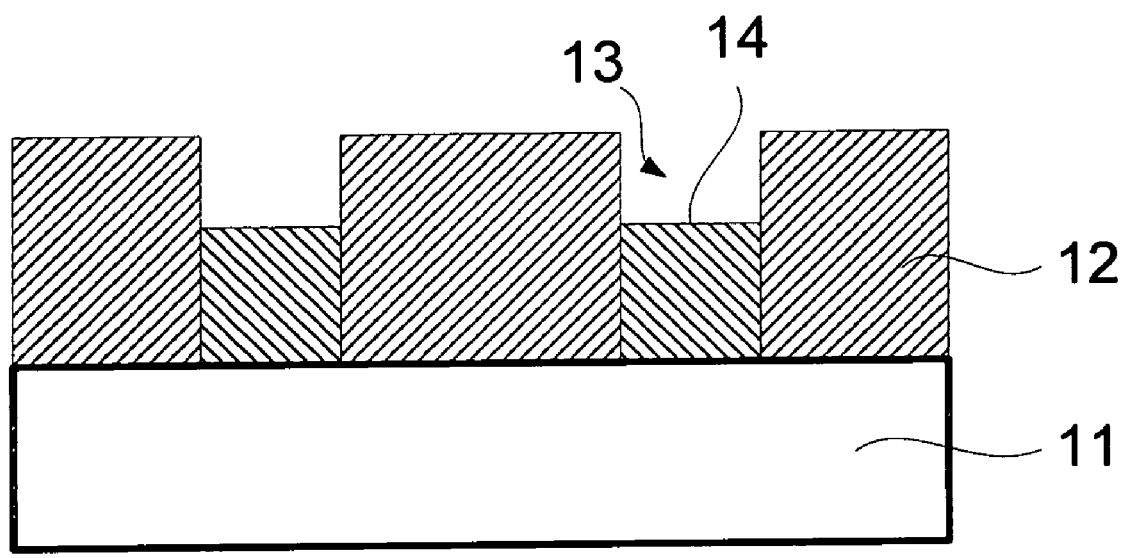
Figure 1C:
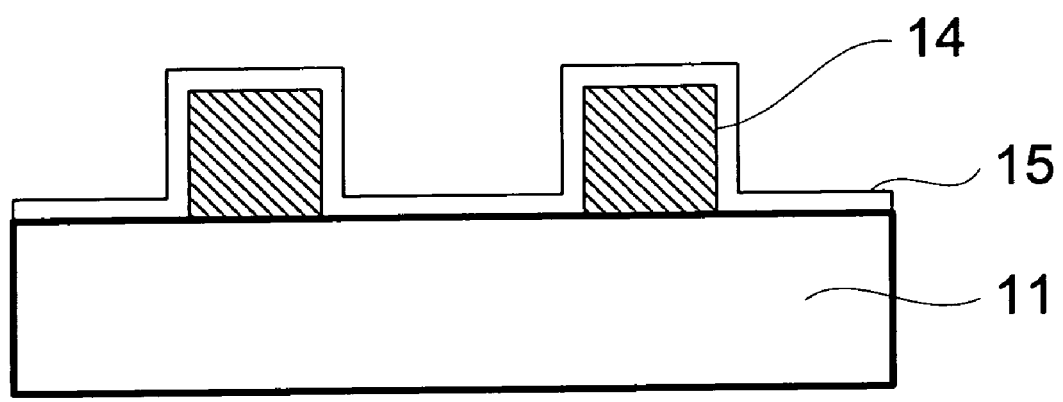

Please refer to FIG. 1a through FIG. 1c, which are views showing the step (a) of the imprinting-damascene process according to a preferred embodiment of the present invention. As shown in the figures, a photoresist 12 (DSE 1010) with a thickness of 350 nm (nanometer) is spin-on coated on a Si wafer 11 and is exposed by an e-beam lithography to obtain a trench 13 on the Si wafer 11 (as shown in FIG. 1a). After the developing, the Si wafer 11 is immersed into a plating solution (not shown in the figures) and the Si is replaced by a metal which can be Au, Cu, Pt, Al, Ti, Ta, Ru or W (as shown in FIG. 1b). Then, the photoresist 12 is striped and a metal nano-wire 14,15 with a thickness of 100 to 200 nm is obtained (as shown in FIG. 1c).

Figure 1D:
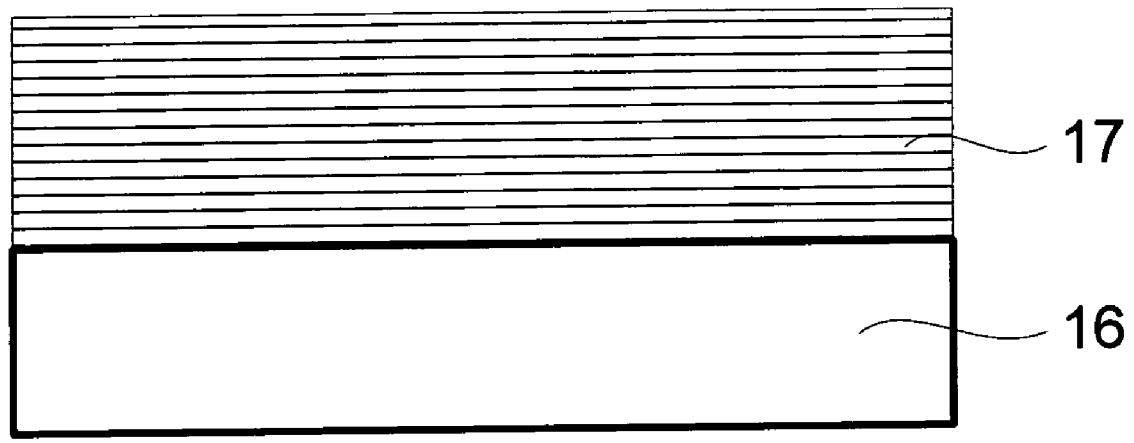

Please refer to FIG. 1d, which is a view showing the step (b) of the imprinting-damascene process according to the preferred embodiment of the present invention. As shown in the figure, an HSQ 17 with a thickness around ~250–600 nm is diluted with a MIBK in a rate of 1:0 to 1:2 and is spin-on coated on another Si wafer 16 under a rotating velocity of 1000 rpm and 6000 rpm. And the HSQ 17 is prebaked under a temperature of 150° C. for 3 minutes.

Figure 1E:
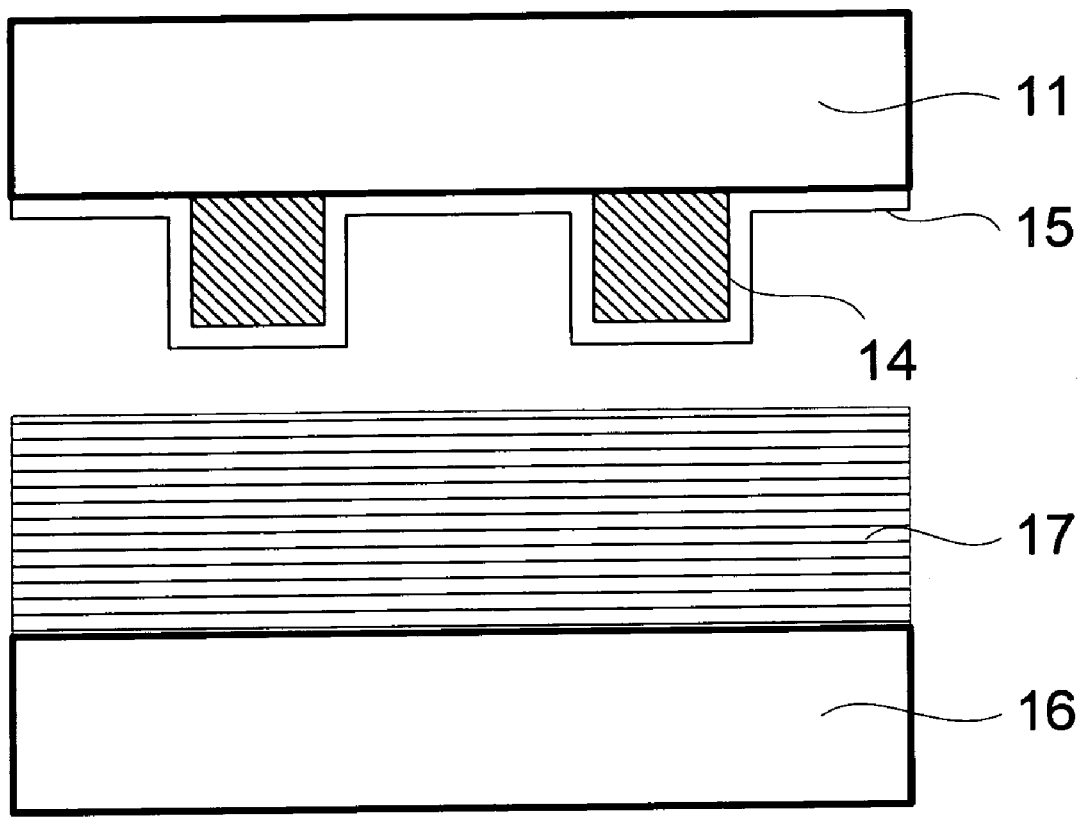
Figure 1F:
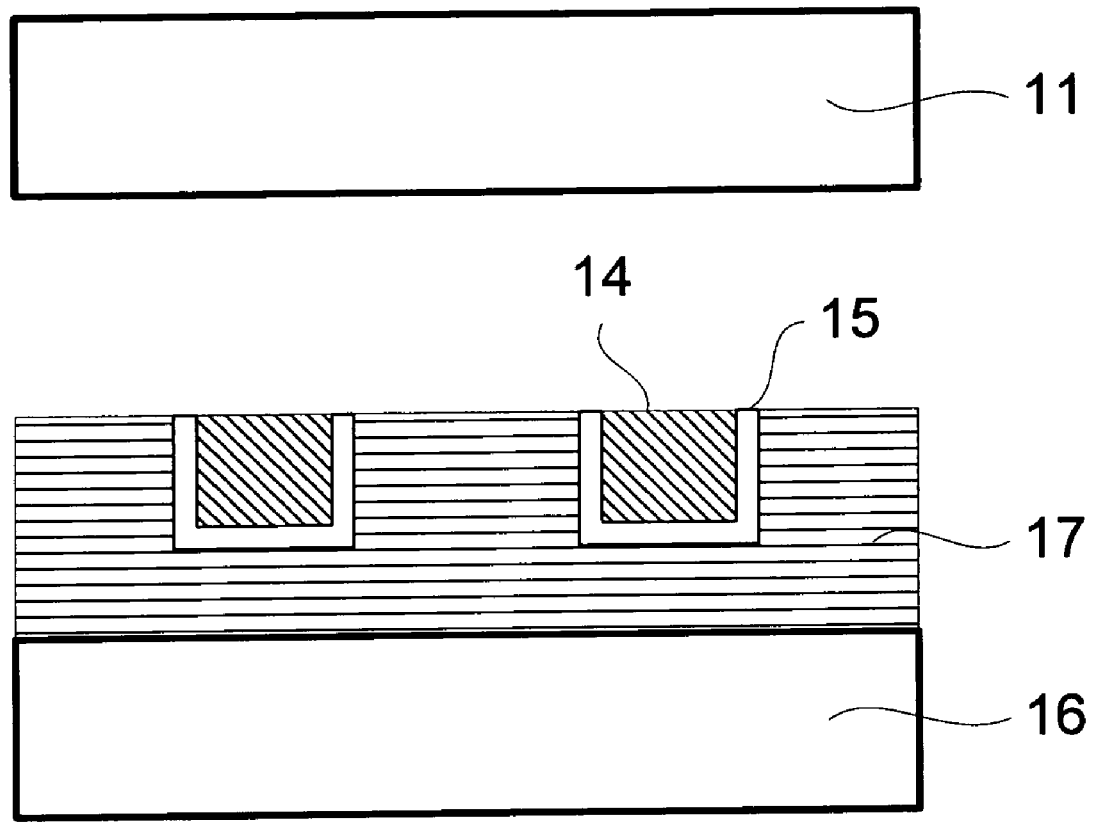
Figure 2A:
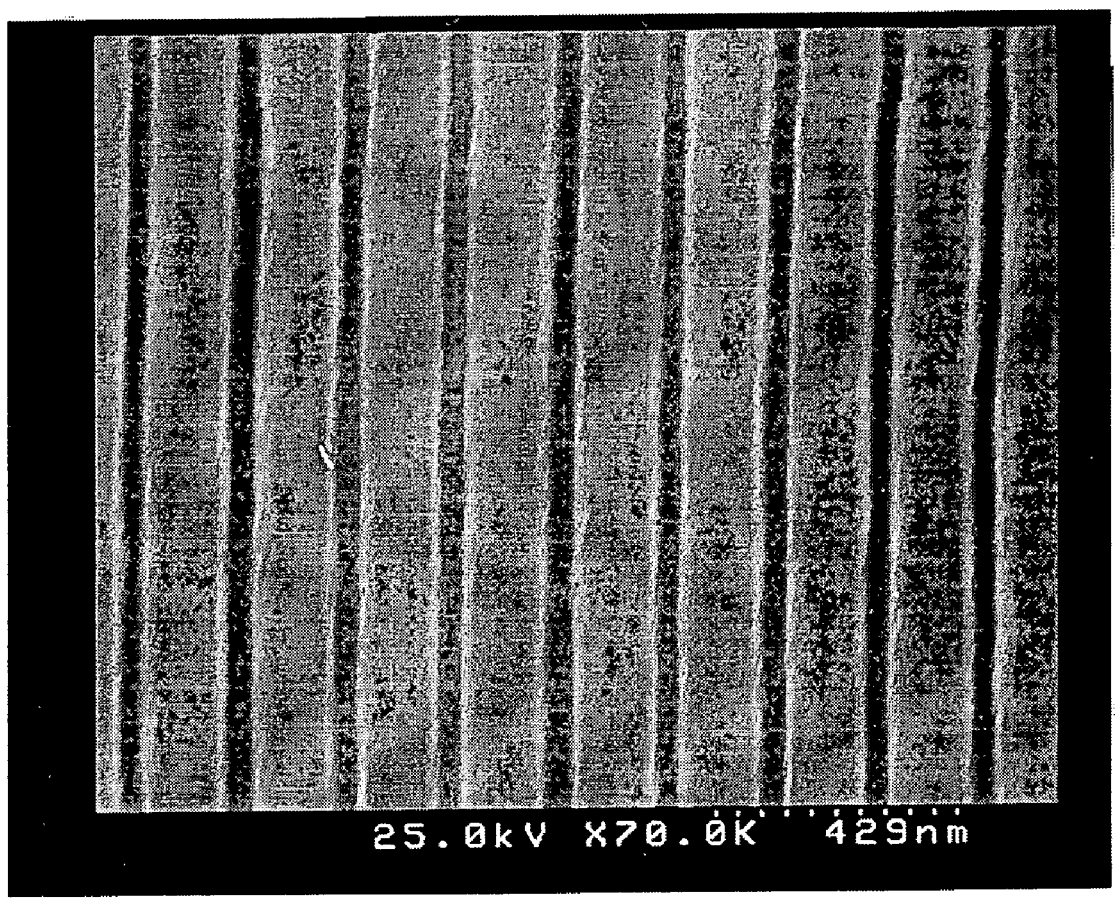
FIG. 2a and FIG. 2b are views showing SEM (Scanning Electron Microscope) photos of nano-scale HSQ trenches fabricated by an imprinting process according to the preferred embodiment of the present invention.
Figure 2B:
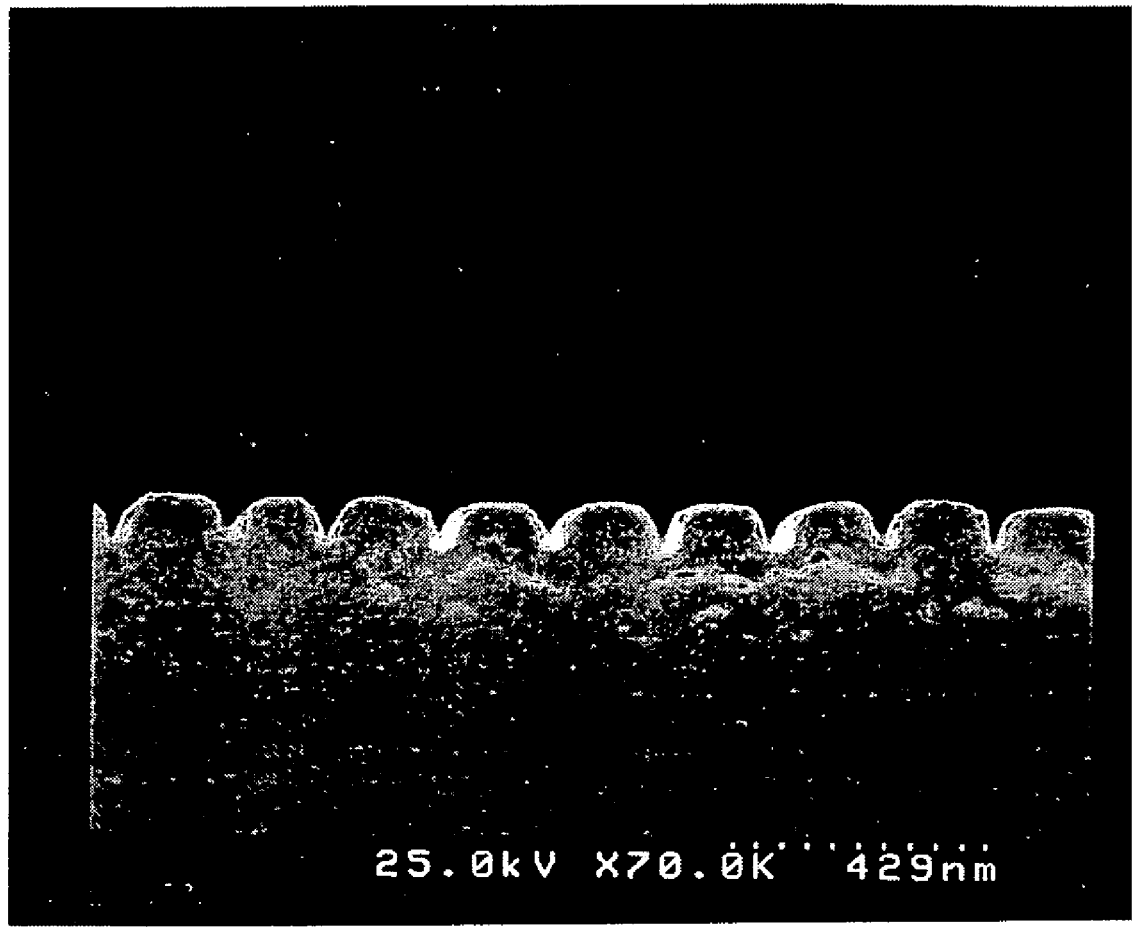

Please refer to FIG. 1e and FIG. 1f, which are views showing the step (c) of the imprinting-damascene process according to the preferred embodiment of the present invention. An imprinting facility (such as Nanonex NX-1000, not shown in the figures) is used to obtain trenches by using metal nano-wires 14, 15 through an NTP. Please further refer to FIG. 2a and FIG. 2b, which are views showing SEM (Scanning Electron Microscope) photos of nano-scale HSQ trenches fabricated by an imprinting process according to the preferred embodiment of the present invention. The HSQ 17 is prebaked under 50–200° C. at first. Then the metal nano-wire 14, 15 is transferred on HSQ 17 under a pressure of 1~2.5 MPa (mega Pascal) and a temperature of 150~200° C., where the patterns on the HSQ 17 is not distorted after 4 days of exposing in the air (as further referring to FIG. 3a and FIG. 3b). The imprinting process with a low pressure and a high temperature is still necessary for the nano-imprinting process on the HSQ. Finally, the silicon wafer 11 is removed to obtain the metal line 14, 15.

Figure 3A:
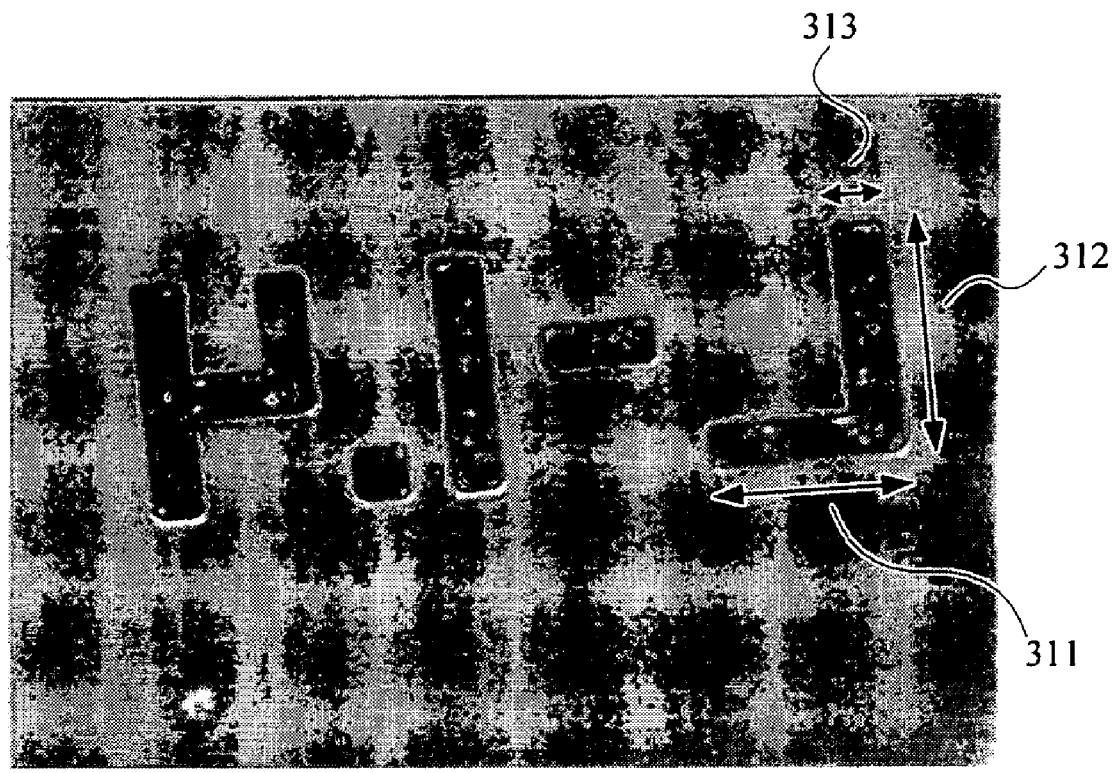
FIG. 3a is a view showing an optical microscope photo of metal-line patterns before 4 days of being exposed in the air according to the preferred embodiment of the present invention.
Figure 3B:
FIG. 3b is a view showing an optical microscope photo of metal-line patterns after 4 days of being exposed in the air according to the preferred embodiment of the present invention.
Figure 4:
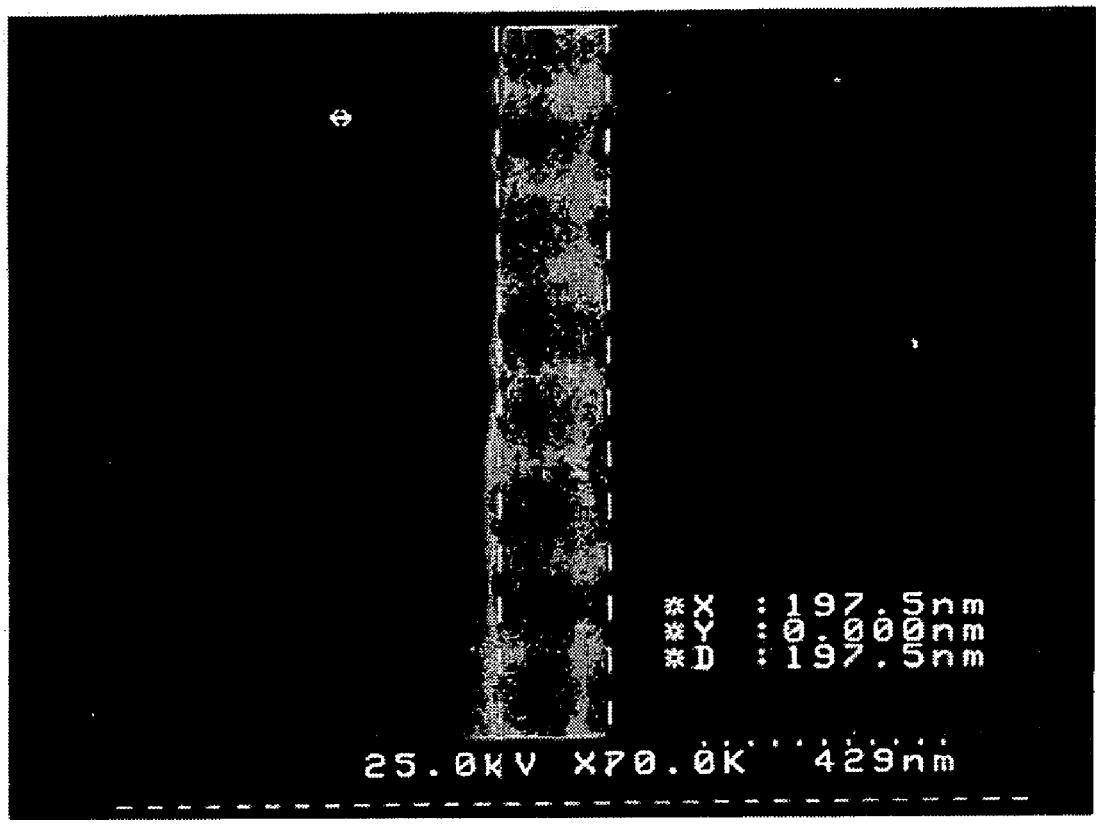
FIG. 4 is a view showing a SEM photo of a nano-scale Au line fabricated by the imprinting process according to the preferred embodiment of the present invention.
Figure 5A:
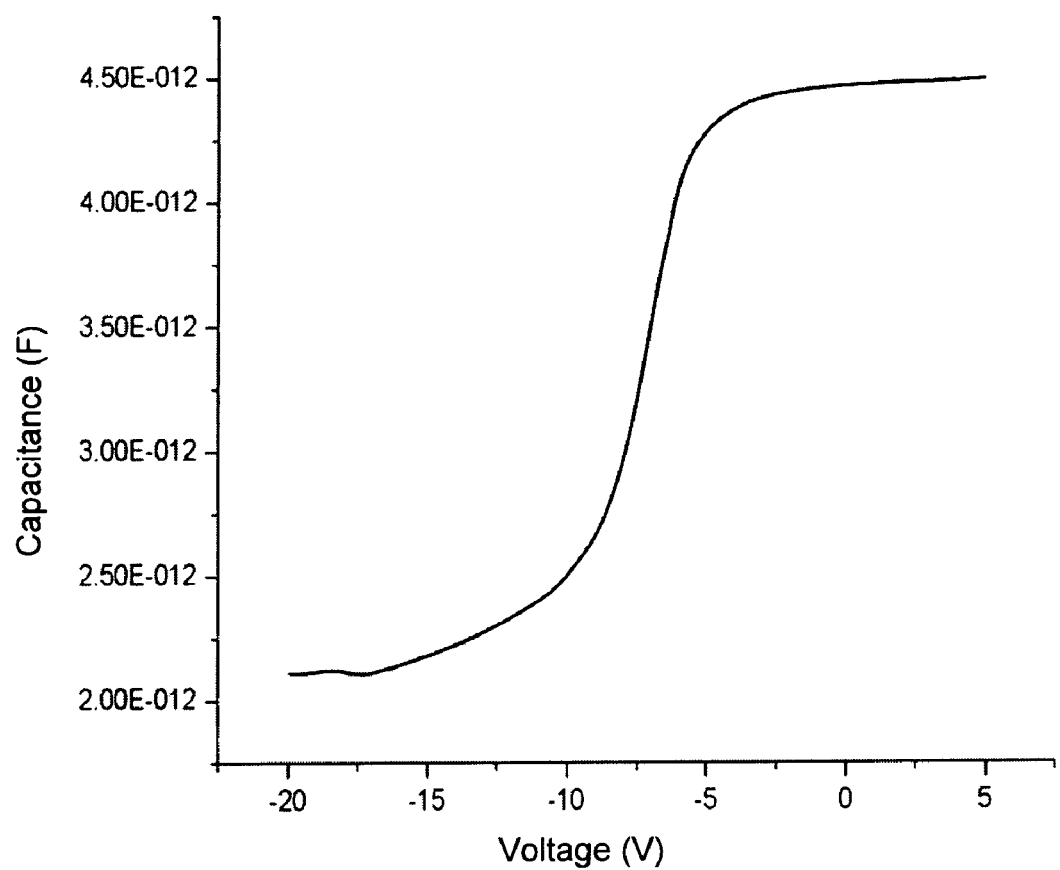
FIG. 5a is a view showing a CV (Capacitance-Voltage) curve of an HSQ dielectric before the imprinting process according to the preferred embodiment of the present invention.
Figure 5B:
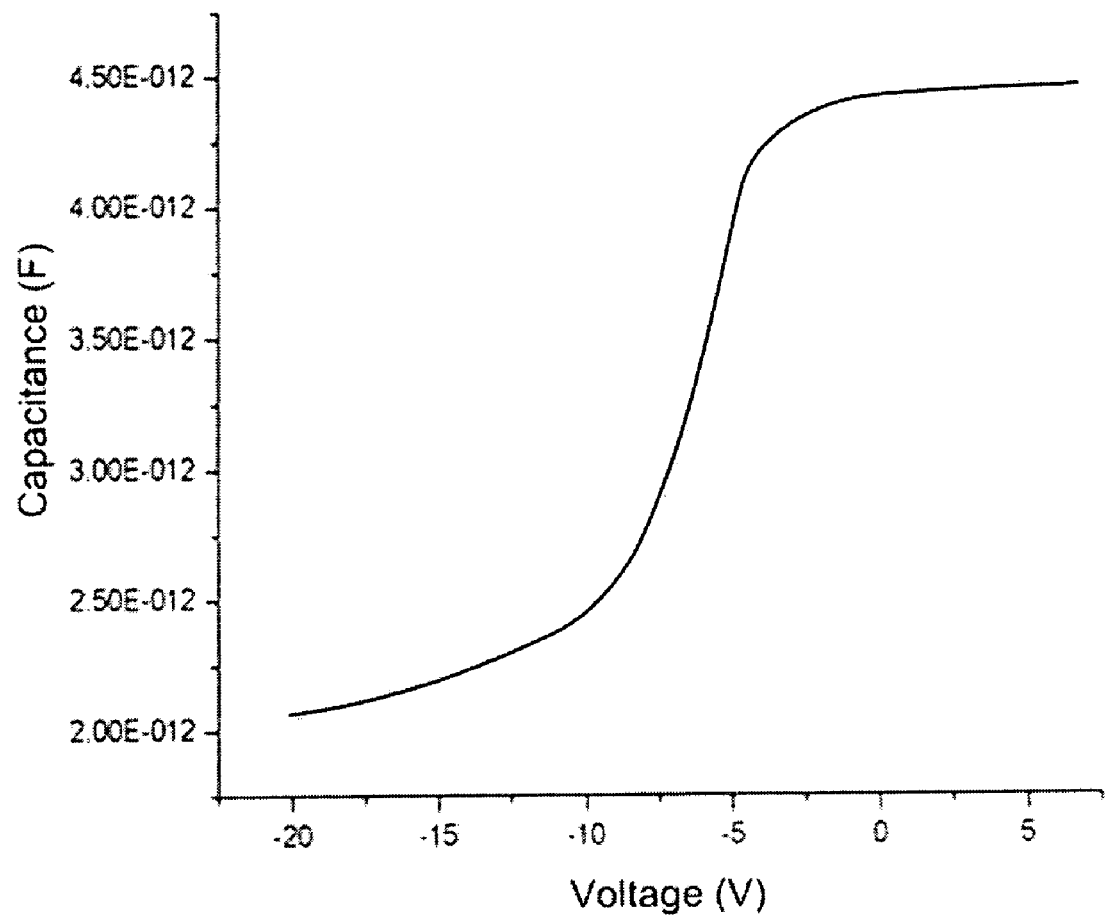
FIG. 5b is a view showing a CV curve of the HSQ dielectric after the imprinting process according to the preferred embodiment of the present invention.
Figure 6A:
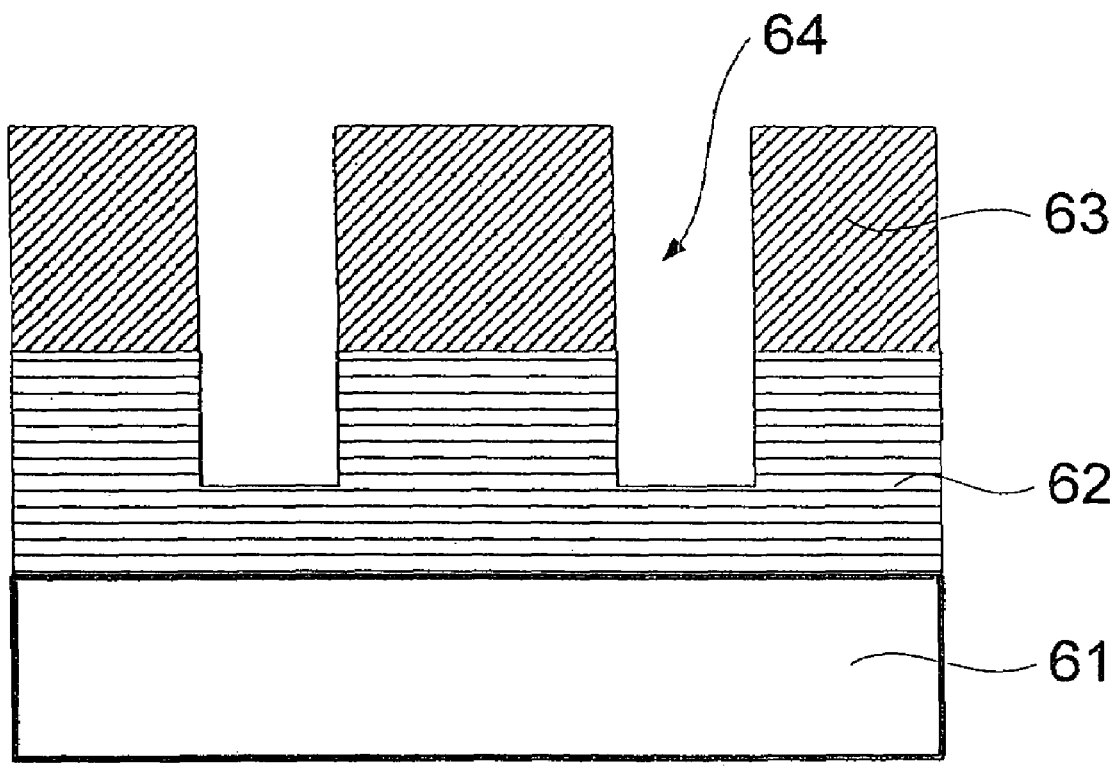
FIG. 6a through FIG. 6e are views showing the imprinting process for a damascene metal-line architecture of a prior art.
Figure 6B:
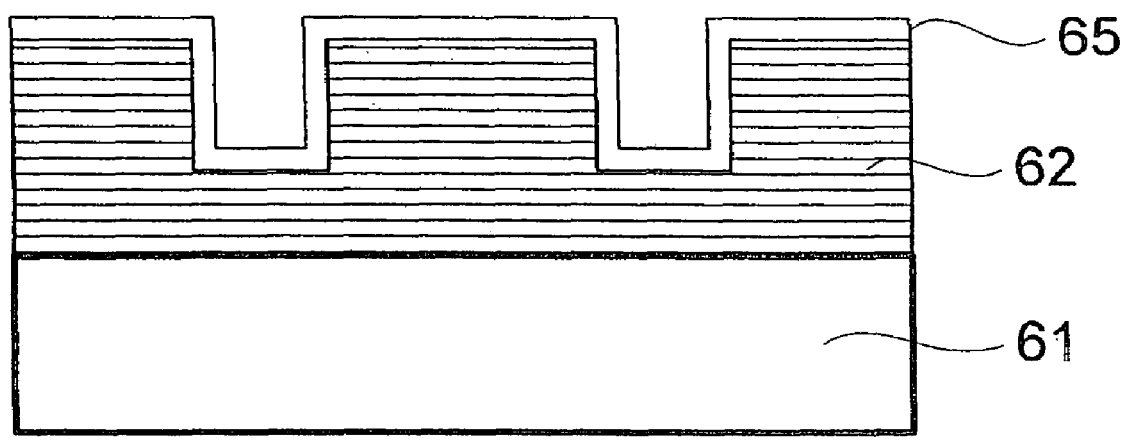
Figure 6C:
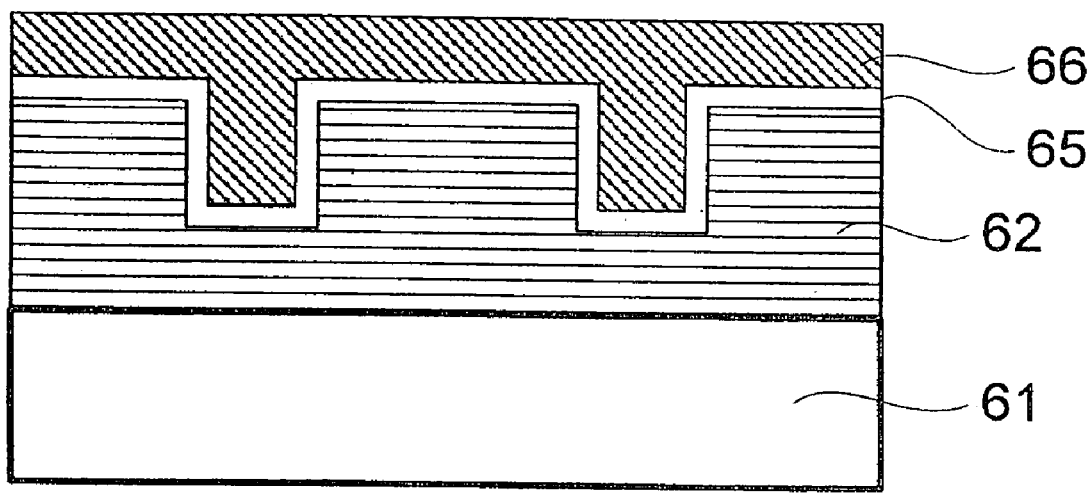
Figure 6D:
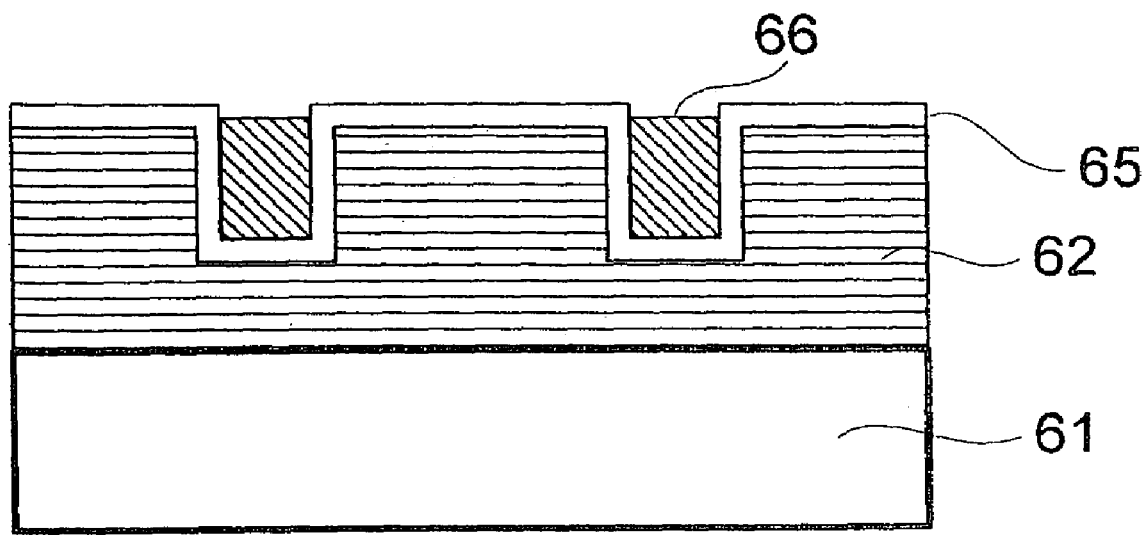
Figure 6E:
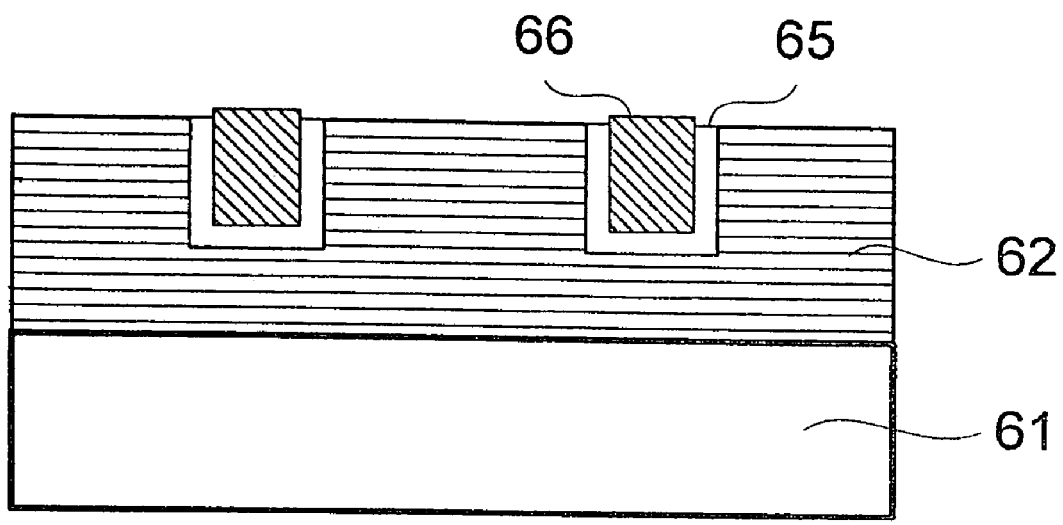

Please refer to FIG. 3a through FIG. 4, which are views showing optical microscope photos of metal-line patterns before and after 4 days of being exposed in the air and a view showing a SEM photo of a nano-scale Au line fabricated by the imprinting process, according to the preferred embodiment of the present invention. In FIG. 3a and FIG. 3b, lines comprising one with a thickness of 48 um (micrometer) for a first width 311, one with 62 um for a second width 312, one with 12 um for a third width 312, one with 48 um for a fourth width 312, one with 62 um for a fifth width 312 and one with 12 um for a sixth width 312 are shown. The nano-scale Au line is transferred from the nano-wire with a width of 197 nm. Please refer to FIG. 5a and 5b, which are views showing a CV (Capacitance-Voltage) curve of an HSQ dielectric before and after the imprinting process according to the preferred embodiment of the present invention. The views are obtained by a prebaking under a rate of 4:5 for HSQ: MIBK and a temperature of 150° C., where the two CV curves are almost the same and the value for the dielectric is remained as 2.8.

In the present invention, the imprinting metal damascene of the Au/Cu metal line with a thickness of ~100–200 nm is fabricated and the barrier metal with a thickness of ~10 nm is deposited by a PVD or a CVD. The metal line is imprinted into the low-K material (about a thickness of 200–450 nm) to obtain the structure. There are no complicated etching, cleaning, filling high aspect ratio structure, and CMP process required. The whole process is much easier with lower cost. All what is required is to properly control the immersing plating and the imprinting process.

As stated above, the present invention is an imprinting-damascene process for a metal interconnection effectively produced and easily used. The main characteristics and advantages are as follows:

(A) Concerning the Mold Fabrication:

The metal nano-wire mold is fabricated by an e-beam lithography and an electroless plating. According to the present invention, the process for the mold fabrication can also comprise steps of using an e-beam lithography to obtain a Si-mold first, then using an NIL process (with the Si-mold) to obtain a photoresist, and then using an electroless plating to obtain a metal nano-wire mold. Since the e-beam lithography process is used one time only, the time and the cost for the process are saved.

(B) Concerning the Low-k Coated Mold:

The HSQ is first diluted with an MIBK in a rate of 1:0 to 1:2 and then is coat on the substrate under a rotating velocity of 1000 rpm to 6000 rpm and is further prebaked for 3 minutes under a proper temperature during 100 to 150° C.

(C) Concerning the NTP Under a Low Pressure:

The environment for the present invention comprises a pressure of ~2.5 MPa, which is lower than the original pressure of 2.5 to 4 MPa, a temperature of 150 to 200° C., which is much lower than the temperature of ~450° C. for a conventional metallization process, and a period of 2 minutes for imprinting. For the NTP process, the metal line is imprinted into the low-K material to obtain a damascene structure. Like other NIL technologies, this process is easy to use with high throughput and low cost for future applications.

To sum up, the present invention is an imprinting-damascene process for a metal interconnection, which is a technology for an easy metal-line imprinting with low cost and high throughput, as a future solution for a general low-K metal damascene structure through CMP to be applied in metallization processes for various kinds of ULSI (Ultra Large Scale Integration), especially those under 90 nm.

The preferred embodiment herein disclosed is not intended to unnecessarily limit the scope of the invention. Therefore, simple modifications or variations belonging to the equivalent of the scope of the claims and the instructions disclosed herein for a patent are all with in the scope of the present invention.

What is claimed is:

1. An imprinting-damascene process for a metal interconnection, comprising steps of:
   (a) obtaining a metal mold with a metal line by an e-beam lithography and an electroless plating;
   (b) obtaining a spin-on low-K layer; and
   (c) transferring said metal mold into said spin-on low-K layer to obtain said metal line by processing an NTP (Nano-Transfer Printing).

2. The process according to claim 1, wherein said step (a) comprises steps of:
   (i) obtaining a photoresist patterned by said e-beam lithography; and
   (ii) obtaining said metal mold with a metal line on said photoresist by a deposition through said electroless plating.

3. The process according to claim 1, wherein said step (b) comprises steps of:
   (i) obtaining a diluted spin-on low-K substrate; and
   (ii) obtaining said spin-on low-K layer by prebaking said spin-on low-K substrate.

4. The process according to claim 1, wherein said step (c) comprises steps of:
   (i) imprinting said metal mold with a metal line into said spin-on low-K layer; and
   (ii) removing said metal mold to obtain said metal line.

5. The process according to claim 1, wherein said metal line is made of a material selected from a group consisting of Au, Cu, Pt, Al, Ti, Ta, Ru and W.

6. The process according to claim 1, wherein said spin-on low-K layer is made of a material selected from a group consisting of a spin-on glass, a hydrogen silsesquioxane, an methyl silsesquioxane (MSQ), an organosilicate glass, a polymer, a porous MSQ, a porous polymer, a xero-gel, and an ultra low-K material.

7. The process according to claim 1, wherein said spin-on low-K layer comprises a plurality of holes and a plurality of trenches.

8. The process according to claim 1, wherein said spin-on low-K layer comprises a plurality of metal lines.

9. The process according to claim 1, wherein said process comprising step (a), step (b) and step (c) is processed a plurality of times.

* * * * *